United States Patent [19]

Hayakawa et al.

[11] Patent Number: 4,691,214
[45] Date of Patent: Sep. 1, 1987

[54] OPTICAL SEMICONDUCTOR APPARATUS

[75] Inventors: Toshiro Hayakawa, Nara; Takahiro Suyama, Tenri; Saburo Yamamoto, Nara, all of Japan

[73] Assignee: Sharp Kabushiki Kaisha, Osaka, Japan

[21] Appl. No.: 757,975

[22] Filed: Jul. 23, 1985

[30] Foreign Application Priority Data

Jul. 31, 1984 [JP] Japan ................... 59-163212

[51] Int. Cl.⁴ ........................................... H01L 33/00
[52] U.S. Cl. .......................................... 357/17; 357/34; 357/47; 357/55; 357/40; 357/41; 357/49
[58] Field of Search ................... 357/17, 41, 16, 43, 357/49, 47, 55, 34, 80, 81, 30 E, 30 G, 40

[56] References Cited

U.S. PATENT DOCUMENTS

| 3,631,251 | 12/1971 | Lebovec | 250/208 |
| 3,748,480 | 7/1973 | Coleman | 357/16 |
| 4,349,906 | 9/1982 | Scifres et al. | 357/40 |
| 4,490,735 | 12/1984 | Schwaderer | 357/30 |

FOREIGN PATENT DOCUMENTS 3225630 1/1984 Fed. Rep. of Germany .
58-220469 4/1984 Japan .
1448285 9/1976 United Kingdom .

OTHER PUBLICATIONS

Electronics Letters 3/17/83, vol. 19, No. 6, pp. 194–196, A Light-Coupled Bistable Electro-Optical Device–Grothe et al.

Primary Examiner—Martin H. Edlow
Assistant Examiner—D. Featherstone
Attorney, Agent, or Firm—Armstrong, Nikaido, Marmelstein & Kubovcik

[57] ABSTRACT

An optical semiconductor apparatus comprising an optical semiconductor device at the side of one facet of a conductive substrate, an electrical circuit device at the side of the other facet of the conductive substrate, an insulating crystal layer formed by an epitaxial growth technique between the conductive substrate and the electrical circuit device to thereby electrically isolate the electrical circuit device from the optical semiconductor device, and a wiring layer formed on the exterior surface of the insulating crystal layer to connect an electrical connection terminal of the electrical circuit device to an electrical connection terminal of the optical semiconductor device.

2 Claims, 3 Drawing Figures

OPTICAL SEMICONDUCTOR APPARATUS

BACKGROUND OF THE INVENTION

1. Field of the Invention

This invention relates to an optical semiconductor apparatus in which an optical semiconductor device and an electrical circuit device are incorporated in a single body.

2. Description of the Prior Art

With significant advancements in such fields as optical information processing, light communication, etc., it has become necessary to miniaturize optical modules and improve their capabilities by the use of optoelectronic integrated circuits (OEIC), in which optical semiconductor devices such as semiconductor lasers, photodetectors, etc., and electrical circuit devices such as operating circuits, modulators, etc., are integrated onto the same substrate. In a conventional OEIC, since a number of electrical circuit devices are formed on the same substrate, they must be electrically insulated from each other. Moreover, since a number of optical semiconductor devices having different structures are formed on the same substrate, the use of a step-shaped substrate is unavoidable, causing difficulties in growing the required crystals. Especially, in cases where semiconductor lasers are used as optical semiconductor devices, the semiconductor devices must be placed at a great distance from the heat-radiating board on which the OEIC should be mounted, since they must be integrated onto a semi-insulating substrate which is thick enough to also support electrical circuit devices thereon, causing a decrease in the heat-radiation effect of the semiconductor lasers. Semi-insulating substrates which can be used to support and insulate semiconductor lasers and electrical circuit devices have a high defect density which causes a decrease in the reliability of the semiconductor lasers formed thereon or an increase in the dark current in photodetectors which can be used instead of the semiconductor lasers.

FIG. 2 shows a conventional OEIC, wherein a semiconductor laser and a field effect transistor for operating the semiconductor laser, respectively, are formed on the upper portion and the lower portion of a GaAs semi-insulating step-shaped substrate 1 and both devices are electrically connected to each other by an n-GaAs wiring layer 2. The OEIC is produced as follows: After growth of an active layer 9 for the field effect transistor, the area other than the portion of the substrate 1 corresponding to the semiconductor laser is coated with a SiO₂ film 3, followed by the selective growth of an n-GaAlAs cladding layer 4, a GaAlAs active layer 5, a p-GaAlAs cladding layer 6 and a p-GaAs cap layer 7, resulting in a doubleheterostructure for laser oscillation. Then, the SiO₂ film on the field effect transistor area is removed, and a source electrode 10, a gate electrode 11 and a drain electrode 12, all of which serve as electrodes for the field effect transistor, are formed on the active layer 9. A p-side electrode 13 for laser oscillation is formed on the cap layer 7. The resulting OEIC is mounted on a heat-radiating board through the substrate 1 having the thickness of as much as approximately 100 μm, which causes the suppression of radiation of heat which generates in the laser oscillation operation. Moreover, the height of the step of the substrate, although depending upon the precision of the etching processing for the step, is as much as approximately several μm, which causes difficulty in the succeeding photolithographic process for the formation of the doubleheterostructure. The use of the semi-insulating substrate also causes a decrease in the reliability of the semiconductor laser.

SUMMARY OF THE INVENTION

The optical semiconductor apparatus which overcomes the above-discussed and numerous other disadvantages the deficiencies of the prior art, comprises an optical semiconductor device at the side of one facet of a conductive substrate, an electrical circuit device at the side of the other facet of the conductive substrate, an insulating crystal layer formed by an epitaxial growth technique between the conductive substrate and the electrical circuit device to thereby electrically isolate the electrical circuit device from the optical semiconductor device, and a wiring layer formed on the exterior surface of the insulating crystal layer to connect an electrical connection terminal of the electrical circuit device to an electrical connection terminal of the optical semiconductor device.

The polarity of said insulating crystal layer is, in a preferred embodiment, different from that of each of the adjacent layers sandwiching said insulating crystal layers at the interface therebetween.

Thus, the invention described herein makes possible the objects of (1) providing a novel and useful optical semiconductor apparatus which has an excellent heat radiation of the optical semiconductor device therein, resulting in an increased reliability thereof; (2) providing a novel and useful optical semiconductor apparatus in which there is no influence from the step of the substrate on the photolithographic process for the formation of multiple-layered crystals of both the semiconductor device and the electrical circuit device therein; (3) providing a novel and useful optical semiconductor apparatus which uses a conductive substrate instead of a conventional semi-insulating step-shaped substrate, resulting in improved characteristics of the optical semiconductor device; and (4) providing a novel and useful optical semiconductor apparatus in which by the use of a high quality and conductive substrate, an electrical circuit device and an optical semiconductor device can be integrated onto the same substrate, resulting in improved capabilities of the optical semiconductor device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
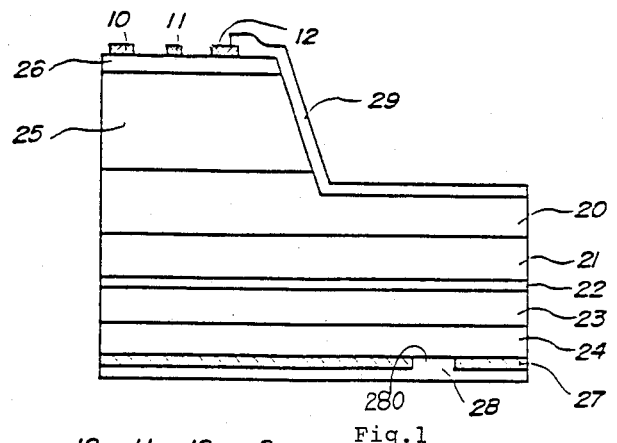
FIG. 1 is a sectional view showing an optical semiconductor apparatus of this invention in which a field effect transistor and a semiconductor laser are integrated onto the same substrate.
Figure 2:
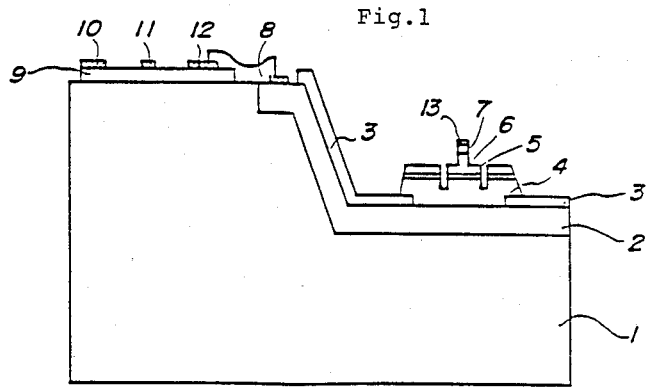
FIG. 2 is a sectional view showing a conventional optical semiconductor apparatus in which a field effect transistor and a semiconductor laser are integrated on the same step-shaped substrate.

FIG. 1 shows an optical semiconductor apparatus of this invention in which a field effect transistor and a semiconductor laser, respectively, are integrated onto both faces of an n-GaAs substrate. This semiconductor apparatus in produced as follows: On one facet (e.g., the lower face) of a Si doped n-GaAs substrate (a dislocation density thereof being 1000/cm$^2$ or less) 20, an n-GaAlAs cladding layer 21, a GaAlAs active layer 22 for layer oscillation, a p-GaAlAs cladding layer 23 and a p-GaAs cap layer 24 are successively grown by liquid phase epitaxy, resulting in a multiple-layered crystal of a doubleheterostructure for laser oscillation. Then, on the other facet (e.g., the upper surface) of the substrate 20, a non-doped semi-insulating p-GaAlAs layer 25 for electrically isolating the field effect transistor from the semiconductor laser, and an n-GaAs channel layer 26 as an active layer for the field effect transistor are successively grown by liquid phase epitaxy, resulting in semiconductor layers for the field effect transistor. Then, the cap layer 24 is covered with a SiO$_2$ insulating film 27 in a manner to form a striped portion 280, which serves as as an electroconductive region, followed by the formation of a p-side electrode 28 of Cu, Au, Ni, etc., thereon by an evaporation process. Then, the portion containing the central and chamnnel layers 25 and 26 on the substrate 20, which corresponds to the striped portion 280 for laser oscillation, is etched to the extent that the etching reaches the substrate 20 by a well known etching technique, resulting in a step-shaped structure as a whole. Then, source, gate and drain electrodes 10, 11 and 12 for the field effect transistor are formed by a masking evaporation process, etc., on the channel layer 26 in the remaining portion of the central and channel layers 25 and 26 on the substrate 20. In order to connect the drain electrode 12 to the laser operation area, a wiring electrode 29 made of metal, etc., is disposed from the exposed face of the substrate 20, which corresponds to the laser operation area, to the drain electrode 12 along the exposed faces of the central and channel layers 25 and 26, resulting in an electrical path for the supply of current from the field effect transistor to the semiconductor laser.

A current which has been applied to the wiring electrode 29 and the p-side electrode 28 flows into the optical semiconductor apparatus through the electroconductive region 280 of a striped structure by which the current is constricted, thereby attaining laser oscillation within the area of the active layer 22 corresponding to the electroconductive region 280. This laser operation area is electrically isolated from the channel layer 26 of the field effect transistor by the central layer 25, so that both the laser operation area and the transistor can operate independently. The field effect transistor containing the channel layer 26 serves to control the current, which has been applied to the source electrode 10, by a voltage applied to the gate electrode 11 to thereby set the amount of the drain current which flows from the drain electrode 12 to the wiring electrode 29. Depending upon the operation of the field effect transistor, laser oscillation in the laser operation area is modulated and controlled. Thus, the semiconductor apparatus of this invention is provided with a switching system for the laser light and/or a modulating system for the strength of the laser output power.

Instead of the striped structure formed by the oxide film 27, a planar structure, etc., in which impurities are diffused in the current path alone to result in an electroconductive region, can be used. An area functioning as a photo-emitting diode instead of the laer oscillation area can be formed to be operated by the above-mentioned field effect transistor. Heat, which generates in the laser oscillation portion, the photo-emitting portion, etc., can be released therefrom by mounting the p-side electrode 28 on a heat-sink etc., as desired, thereby allowing for suppression of the rise of temperature of the semiconductor apparatus and allowing for the retention of a stabilized output operation. Moreover, since a conductive substrate of a high quality is used as the substrate 20 and a GaAlAs layer formed by an epitaxial growth technique is used as the insulating means between the field effect transistor and the laser operation area, the quality of crystals in both the field effect transistor and the laser operation area is maintained at a high level.

Figure 3:
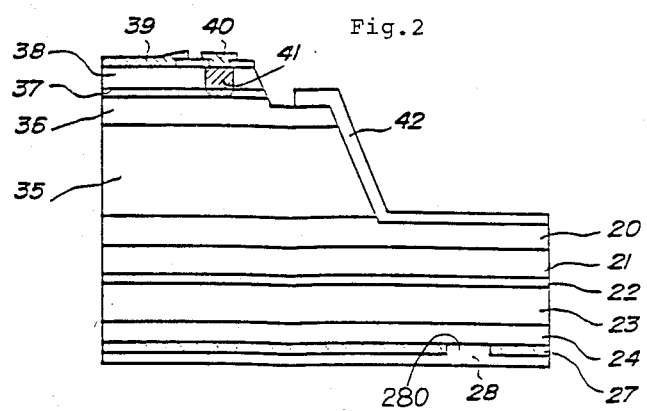
FIG. 3 is a sectional view showing another optical semiconductor apparatus of this invention in which a bipolar transistor and a semiconductor laser are integrated onto the same substrate.

FIG. 3 shows another semiconductor apparatus of this invention, in which a bipolar transistor and a semiconductor laser are integrated onto both faces of an n-GaAs substrate, respectively. In the same manner as in Example of FIG. 1, on one facet of the n-GaAs substrate 20, an n-cladding layer 21, an active layer 22, a p-cladding layer 23 and a cap layer 24 are successively grown, resulting in a multiple-layered crystal for the semiconductor laser. Then, on the other facet of the n-GaAs substrate 20, a p-GaAs layer 35 for isolating the bipolar transistor from the semiconductor laser, an n-GaAlAs collector layer 36 for the bipolar transistor, a p-GaAs base layer 37 and an n-GaAlAs emitter layer 38 are successively grown to form a multiple-layered crystal for the bipolar transistor. Half of this multiple-layered crystal at the side of the laser operation area is then etched. Thereafter, the cap layer 24 is covered with a SiO$_2$ insulating film 27 in a manner to form a striped portion 280 as an electroconductive region, and a p-side electrode 28 as in FIG. 1. Zn-diffusion is carried out in the region containing both the base layer 37 and the emitter layer 38 underneath the base electrode 40 of the bipolar transistor, resulting in a diffusion layer 41. Emitter and base electrodes 39 and 40 are disposed on the emitter layer 38. A wiring layer 42 is formed on the exposed face of the collector layer 36, the exposed slope of the central layer 35 and the exposed face of the substrate 20 to connect the collector layer 36 to the laser operation area of the semiconductor laser. In this Example, a conductive substrate of a high quality is also used as the substrate 20 and the epitaxial growth layer 35 is used as an insulating means, for isolating one device from the other, which has a different polarity from that of the collector layer 36, so that the crystallizability of each of the layers for the bipolar transistor can be significantly improved as compared with that of each of the layers for the bipolar transistor in the case where a semi-insulating substrate is used as the substrate 20.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. An optoelectronic integrated circuit apparatus comprising:
   a planar conductive substrate having a first facet at a first planar surface thereof and a second facet at a second planar surface thereof on the opposite side of said planar substrate from said first planar surface;
   an electrical circuit device comprising at least one transistor formed on said substrate at said first facet, said electrical circuit device being isolated from said conductive substrate by a semi-insulating layer formed on said first facet between said substrate and said electrical circuit device;
   an optical semiconductor device comprising at least one of a semiconductor laser oscillator area and a photo-emitting diode formed on said second facet; and
   a wiring layer providing an electrical connection between said electrical circuit device and said optical semiconductor device formed on an exterior surface of said semi-insulating layer.

2. An optoelectronic integrated circuit apparatus according to claim 1 wherein the polarity of said semi-insulating layer is different from that of each of the adjacent layers sandwiching said semi-insulating layers at the interface therebetween.

* * * * *